(12) United States Patent
Krijn, I et al.

(10) Patent No.: US 12,484,363 B2
(45) Date of Patent: Nov. 25, 2025

(54) LIGHT EMITTING DEVICE COMPRISING A FLEXIBLE LIGHT MATRIX

(71) Applicant: SIGNIFY HOLDING B.V., Eindhoven (NL)

(72) Inventors: Marcellinus Petrus Carolus Michael Krijn, I, Eindhoven (NL); Bartel Marinus Van De Sluis, Eindhoven (NL); Michel Cornelis Josephus Marie Vissenberg, Roermond (NL); Leendert Teunis Rozendaal, Valkenswaard (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 217 days.

(21) Appl. No.: 18/270,647

(22) PCT Filed: Dec. 28, 2021

(86) PCT No.: PCT/EP2021/087720
§ 371 (c)(1),
(2) Date: Jun. 30, 2023

(87) PCT Pub. No.: WO2022/148692
PCT Pub. Date: Jul. 14, 2022

(65) Prior Publication Data
US 2024/0014248 A1 Jan. 11, 2024

(30) Foreign Application Priority Data
Jan. 5, 2021 (EP) ...................................... 21150150

(51) Int. Cl.
*H10H 29/14* (2025.01)
*F21V 3/06* (2018.01)
(Continued)

(52) U.S. Cl.
CPC ......... *H10H 29/142* (2025.01); *F21V 3/0625* (2018.02); *F21V 23/003* (2013.01); *F21Y 2107/70* (2016.08); *F21Y 2115/10* (2016.08)

(58) Field of Classification Search
CPC .... H01H 29/142; F21V 3/0625; F21V 23/003
See application file for complete search history.

(56) References Cited

U.S. PATENT DOCUMENTS

| | | | |
|---|---|---|---|
| 6,109,765 A * | 8/2000 | Blanton | F21S 4/10 362/396 |
| 6,179,440 B1 | 1/2001 | Palmer | |

(Continued)

FOREIGN PATENT DOCUMENTS

| | | |
|---|---|---|
| CN | 206582544 U | 10/2017 |
| EP | 3598906 A1 | 1/2020 |

(Continued)

*Primary Examiner* — Bryon T Gyllstrom

(57) ABSTRACT

The present invention relates to a light emitting device (1) comprising a flexible and/or stretchable body (2), a plurality of nodes (3), and a plurality of connecting elements (4). Each node (3) of the plurality of nodes (3) is separated from at least one other node (3) of the plurality of nodes (3) by one or more connecting element (4) of the plurality of connecting elements (4). At least one of the plurality of nodes (3) and the plurality of connecting elements (4) are attached to the body (2). One or more nodes of the plurality of nodes (3) are at least one of a light source, a passive element, an electrically conductive element and a passive element. One or more connecting elements of the plurality of connecting elements (4) are at least one of a light source and an electrically conductive element. The connecting elements of the plurality of connecting elements (4) are at least one of flexible and stretchable.

8 Claims, 2 Drawing Sheets

(51) Int. Cl.
*F21V 23/00* (2015.01)
*F21Y 107/70* (2016.01)
*F21Y 115/10* (2016.01)

(56) References Cited

U.S. PATENT DOCUMENTS

| | | | |
|---|---|---|---|
| 11,437,462 B2* | 9/2022 | Kim | H10K 59/121 |
| 2017/0307150 A1 | 10/2017 | Dai et al. | |
| 2018/0356055 A1* | 12/2018 | Magielse | F21V 23/06 |
| 2019/0170304 A1 | 6/2019 | Jiang | |
| 2021/0028155 A1* | 1/2021 | Kim | H05K 1/0283 |
| 2021/0066266 A1* | 3/2021 | Jung | H10H 29/142 |
| 2021/0265328 A1* | 8/2021 | Lee | H10H 20/855 |
| 2024/0221562 A1* | 7/2024 | Choi | G09G 3/32 |

FOREIGN PATENT DOCUMENTS

| | | |
|---|---|---|
| ES | 1212138 U | 5/2018 |
| JP | 2011065873 A | 3/2011 |
| WO | 2017031153 A1 | 2/2017 |

* cited by examiner

LIGHT EMITTING DEVICE COMPRISING A FLEXIBLE LIGHT MATRIX

CROSS-REFERENCE TO PRIOR APPLICATIONS

This application is the U.S. National Phase application under 35 U.S.C. § 371 of International Application No. PCT/EP2021/087720, filed on Dec. 28, 2021, which claims the benefit of European Patent Application No. 21150150.7, filed on Jan. 5, 2021. These applications are hereby incorporated by reference herein.

FIELD OF THE INVENTION

The invention relates to a light emitting device comprising a flexible light matrix, the flexible light matrix comprising a body being at least one of flexible and stretchable, a plurality of nodes, and a plurality of connecting elements.

BACKGROUND OF THE INVENTION

In the market of luminaires and other light emitting devices, a new concept is on the rise in popularity. In this concept consumers may customize the luminaire to obtain the size they want to have. A wide variety of different sizes are made available in this way.

One known way to let consumers customize luminaires is by element of custom size LED light stripes. Since there are numerous applications for LED light strips, there is a need for light strips of different lengths. This requirement can be met by keeping many stock-keeping-units of mutually different sizes and/or shapes. Another option is to make light strips customizable in length (e.g. by cutting them to the desired length). Since the cut-to-measure action is irreversible, it limits future usage options and in addition, the cutting typically damages the robustness of the LED light stripe (e.g. waterproofness). Both options add a cost to the solution.

US-2018/356055 discloses a stretchable chain of chain elements with LED light sources. The chain elements are rigid elements and are interconnected by hinge joints. The chain can be mounted on a stretchable substrate which also can have light exit structures. The chain can also be embedded with the substrate in a flexible material in which the hinging point can be provided by the stretchable substrate. The stretchable chain of LED light strips may be utilized to illuminate a two-dimensional area having an arbitrary shape. Top and/or bottom stretchable sheet material, either or both of which may be polymeric, may be utilized to seal at least portions of the light sheets and form sealed regions that may be water-resistant or waterproof. The chain may even define structural features for mechanical stability.

There is, however, still a desire for providing a luminaire with a size and shape being customizable in an easy, straight forward and more versatile manner and which is not only flexible but also stretchable.

There is furthermore a desire to provide such a light emitting device which also enables at least one of (i) a light output with a maximum or increased amount of light and a minimum or reduced light loss, (ii) a lower amount of waste generated in the customization process, (iii) avoiding loss of electronics or money due to cutting of the LED strip to the desired length during the customization process, (iv) always obtaining the right size for the desired customized use, (v) ideal matching to an optimized driver, and (vi) reuse and thus recycling or the light emitting device in another application.

SUMMARY OF THE INVENTION

It is an object of the present invention to overcome the above-mentioned problems, and to provide a light emitting device which enables a directly/indirectly lit light emitting system or luminaire with a size and shape being customizable in an easy, straight forward and more versatile manner, and which is both flexible and stretchable.

Further objects of the invention include providing such a light emitting device with which at least one of the following becomes possible: (i) obtaining a light output with a maximum or increased amount of light and a minimum or reduced light loss, (ii) generating a lower amount of waste in the customization process, (iii) avoiding loss of electronics or money due to cutting of the LED strip to the desired length during the customization process, (iv) always, or as good as always, obtaining the right size for the desired customized use, (v) ideal matching to an optimized driver, and (vi) reuse and thus recycling of the light emitting device in another application.

According to a first aspect of the invention, this and other objects are achieved by means of a light emitting device comprising (i) a body being at least one of flexible and stretchable, (ii) a plurality of nodes, and (iii) a plurality of connecting elements. Each node of the plurality of nodes is separated from at least one other node of the plurality of nodes by one or more connecting element of the plurality of connecting elements. At least one of the plurality of nodes and the plurality of connecting elements are attached to the body. One or more nodes of the plurality of nodes are at least one of a light source adapted for, in operation, emitting light, a passive element, an electrically conductive element adapted for, in operation, conducting electricity, and an active element. One or more connecting element of the plurality of connecting elements are at least one of a light source adapted for, in operation, emitting light and an electrically conductive element adapted for, in operation, conducting electricity. The connecting elements of the plurality of connecting elements are at least one of flexible and stretchable.

By providing such a light emitting device, and especially by providing that the at least one node of the plurality of nodes are of at least one of the above-mentioned types, that at least one connecting element of the plurality of connecting elements are of at least one of the above-mentioned types, and in particular that the connecting elements of the plurality of connecting elements are connecting elements, a light emitting device which enables a directly/indirectly lit light emitting system or luminaire with a size and shape being customizable in an easy, straight forward and more versatile manner, and which is both flexible and stretchable is provided for.

Furthermore, such a light emitting device enables obtaining several of the further objects mentioned above, especially as adaptation to different uses is enabled without the need of cutting away parts of the light emitting device. This provides for a light emitting device with which it becomes possible to at least obtain a light output with a maximum or increased amount of light and a minimum of reduced light loss, generate a lower amount of waste in the customization process, avoid loss of electronics or money due to cutting of the LED strip to the desired length during the customization process, and reuse and thus recycle the light emitting device in other applications.

In an embodiment, the plurality of connecting elements comprise a light source adapted for, in operation, emitting light and the plurality of nodes are passive elements or comprise an electrically conductive element for, in operation, conduct electricity.

Thereby, a light emitting device is provided with which it becomes possible to stretch the device without inflicting damage to the LED light sources and electrical connections, and which may thus always, or as good as always, obtain the right size for the desired customized use.

In an embodiment, the light source of the plurality of connecting elements is a light source being at least one of a flexible and a stretchable linear light source and a LED filament light source, and wherein a length of the flexible connecting element is larger than the distance between each node of the plurality of nodes being separated from at least one other node of the plurality of nodes by at least one connecting element of the plurality of connecting elements when the body is in a rest position, where the rest position is achieved when no external forces are applied to shape or stretch the body.

Thereby, stretching problems may be overcome and a larger light emitting area is provided which improves the visual comfort of the light source.

In an embodiment, the plurality of nodes comprises a light source adapted for, in operation, emitting light and the plurality of connecting elements comprises an electrically conductive element for, in operation, conduct electricity.

Thereby, a light emitting device is provided with which it becomes possible to stretch the device while still ensuring that all LED light sources are in all situations equally spaced.

The electrically conductive element of the plurality of connecting elements may be a flexible circuit element, and a length of the connecting element may be larger than the distance between each node of the plurality of nodes being separated from at least one other node of the plurality of nodes by at least one connecting element of the plurality of connecting elements when the body is in a rest position, wherein the rest position is achieved when no external forces are applied to shape or stretch the body.

Thereby, a light emitting device is provided with which it becomes possible to directly implement functionalities within a flexible circuit by maintaining the flexibility and stretchability of the light emitting device.

The flexible connecting element may provide any one or more of a power connection and a data connection to neighboring nodes.

Thereby, a light emitting device is provided with which it becomes possible to directly connect a power input or a data input within the flexible connecting element. In case of a power connection, the need of external electronics when interfacing the light emitting device with a power source may be reduced. In case of a data connection, control of the light emitting device by means of an external control device may be provided in a simple manner.

The flexible connecting element may provide a single wire series connection. The flexible connecting element may also provide a multiple wires parallel or addressable connection.

Thereby, the flexible connecting element can be easy and cheap to manufacture for a single wire series connection. Additionally, the flexible connecting element can be used as a parallel connection or can carry different data channels when provided as a multiple or addressable connection. This aspect will imply a simple system for implementing smart lighting and data connectivity.

The flexible connecting element may comprise a silicone-based polymer.

Silicones are a preferred choice of material since they have a high degree of flexibility without being prone to breaking, and since they are durable and resistant while also allowing a high-quality light output. Moreover, silicones can be made to diffuse the light emitted by LED light sources, thereby providing a more uniform light emission.

The light emitting device may comprise a controller adapted for controlling the light sources, or each light source may be associated with a controller, or the active element may be a controller or a transistor.

Such a controller further increases the adaptability of the light emitting device to various purposes and uses by providing various options, e.g. dimming light, and/or changing the color of the light, and/or adapt the light intensity to the surrounding environment, and/or adapt the light intensity to the needed level of comfort, and/or adapt the light intensity to have a consistent light output in various stretching situations.

The light source may comprises a color light source, and the color light source may comprise multiple primary color LEDs.

Thereby, the light source may be configured to emit different multiple primary color light.

The light emitting device may comprise at least one of a carrier material and a cover material, wherein the body may be partially or fully in contact with at least one of the carrier material and the cover material.

Having a carrier material and a cover material that encapsulate the body, and thus the LED light sources, provides stress protection, dust protection and weather protection of the LED light sources.

At least one of the carrier material and the cover material may be a stretchable, flexible and light diffusing material. Alternatively, or additionally, the carrier material and the cover material may be a silicone-based polymer.

Having a carrier material and a cover material of a stretchable, flexible, and light diffusing material that encapsulate the body, and thus the LED light sources, additionally provides a more robust flexible light emitting device with good optical proprieties. Additionally, using silicones as a preferred choice of material, a high degree of flexibility is ensured without being prone to breaking, and since they are durable and resistant a high-quality light output is also allowed.

The light emitting device may comprise at least one of connectors and an attachment element.

Such connectors and an attachment element have a particularly simple and easy to use construction, and thus provide for a light emitting device which is particularly simple to mount on an object or device and to adapt and customize to the object or device.

The light emitting device may comprise a system for at least one of detecting the stretching force and setting a maximum stretch limit.

Providing such a system for at least one of detecting the stretching force and setting a maximum stretch limit introduces a preventive measure enabling avoiding that the body is stretched beyond its limit, thus avoiding unintentional breaking of the light emitting device while stretching it.

The system for at least one of detecting the stretching force and setting a maximum stretch limit may be associated with the controller which is configured to control the light sources based on the detection of the stretching force.

Thereby, the controller can e.g. regulate the emitted light in order to keep constant the amount of light emitted per unit of length, or, e.g., map specific light content pattern or a color/brightness gradient along the device based on the current shape and size of the light emitting device.

The invention further relates to a luminaire comprising a light emitting device according to any one of the above claims.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION OF THE EMBODIMENTS

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1A:
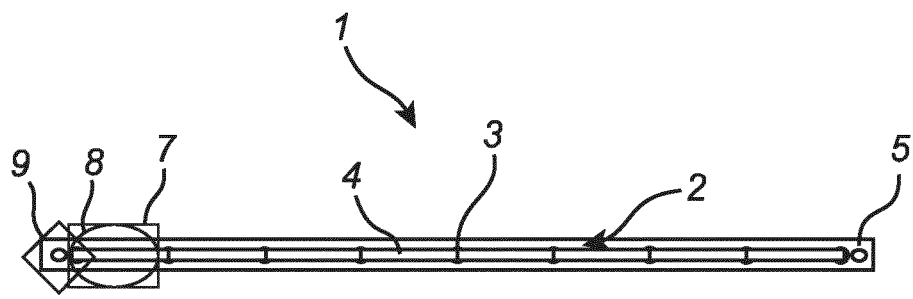
FIGS. 1A and 1B show a perspective view of a light emitting device in a stretched and unstretched condition, respectively.
Figure 1B:
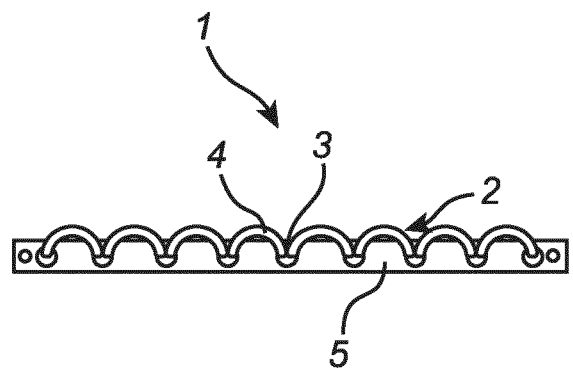
Figure 2A:
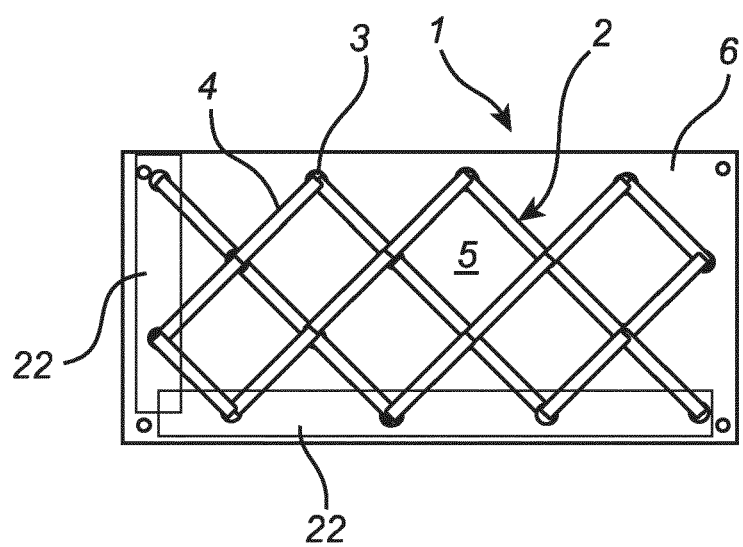
FIGS. 2A and 2B show a perspective view of a light emitting device in a stretched and unstretched condition, respectively.
Figure 2B:
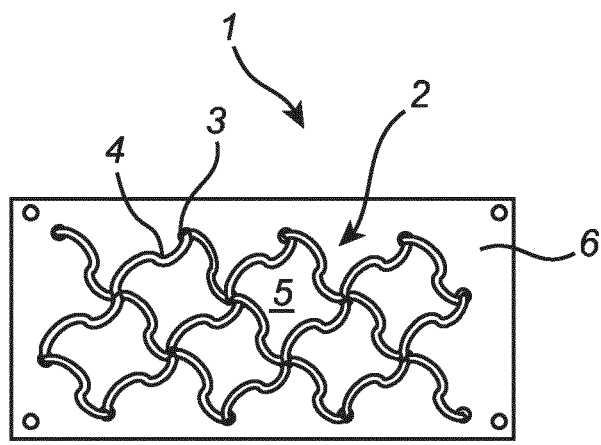

FIGS. 1A and 2B show a perspective view of a light emitting device 1. The light emitting device 1 comprises a body 2 being at least one of flexible and stretchable, a plurality of nodes 3, and a plurality of connecting elements 4. A carrier material 5 may be present. The flexible connecting element 4 may provide or comprise one or more of a power connection 7 and a data connection 7 to neighboring nodes. The light emitting device 1 may comprise at least one controller 8 adapted for controlling the light sources. One controller 8 may be provided for controlling all light sources independently or together. Alternatively, each light source may be associated with a controller 8. The controller 8 may be an external unit or the controller 8 may, as is shown on FIG. 1A, be integrated directly with the remaining light emitting device. The light emitting device 1 may comprise at least one of connectors 9 and an attachment element 9. The connecting elements 4 may each be a light source adapted for, in operation, emitting light, and the nodes 3 may each be a passive element or an electrically conductive element adapted for, in operation, conduct electricity. Such connecting elements 4 may be provided as LED filament light sources. FIG. 1A specifically shows a perspective view of a light emitting device 1 when in a stretched and linear configuration, while FIG. 1B shows a perspective view of a light emitting device 1 when in a rested and linear configuration. Thus, in FIGS. 1A and 1B each node 3 is connected to neighboring nodes 3 by two connection elements 4.

FIGS. 2A and 2B show a perspective view of a light emitting device 1. The light emitting device 1 comprises a body being at least one of flexible and stretchable 2, a plurality of nodes 3, and a plurality of connecting elements 4. A carrier material 5 may be present and a cover material 6 may also be present. The light emitting device 1 may comprise a system 22 for at least one of detecting the stretching force and setting a maximum stretch limit. The connecting elements 4 may each be a light source adapted for, in operation, emitting light and the nodes 3 may each be a passive element or an electrically conductive element adapted for, in operation, conducting electricity. FIG. 2A specifically shows a perspective view of a light emitting device 1 when in a stretched and matrix configuration, while FIG. 2B shows a perspective view of a light emitting device 1 when in a rested and matrix configuration. Thus, in FIGS. 2A and 2B each node 3 is connected to neighboring nodes 3 by two, three, four or more connection elements 4 depending on the position in the matrix, e.g. at an edge or in a central part of the matrix or grid.

Figure 3A:
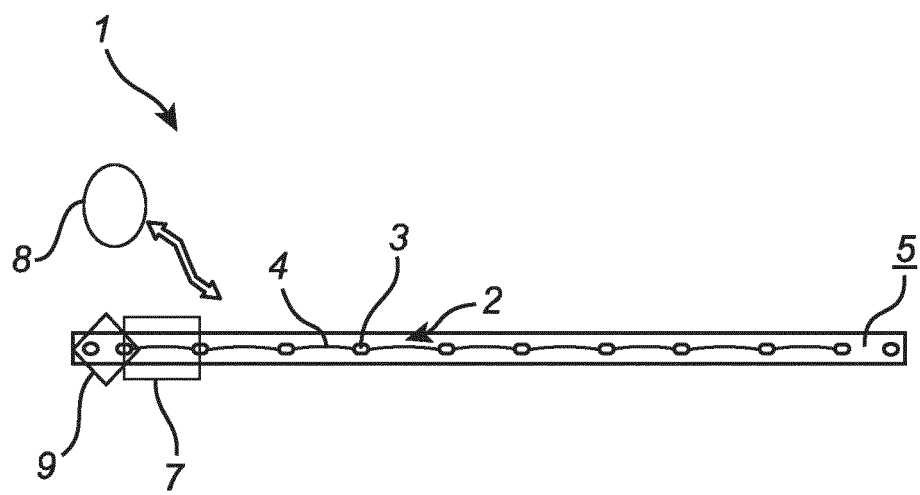
FIGS. 3A and 3B show a perspective view of a light emitting device in a stretched and unstretched condition, respectively.
Figure 3B:
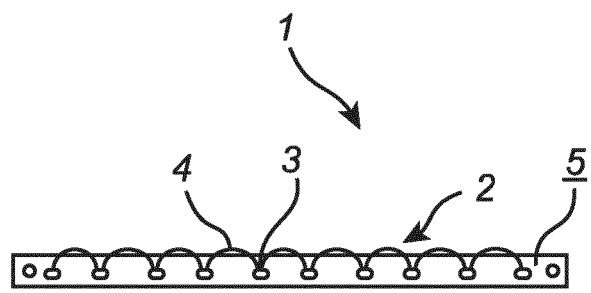

FIGS. 3A and 3B show a perspective view of a light emitting device 1. The light emitting device 1 comprises a body being at least one of flexible and stretchable 2, a plurality of nodes 3, and a plurality of connecting elements 4. A carrier material 5 may be present. The flexible connecting element 4 may provide one or more of a power connection 7 and a data connection 7 to neighboring nodes. The light emitting device 1 may comprise at least one controller 8 adapted for controlling the light sources. One controller 8 may be provided for controlling all light sources independently or together. Alternatively, each light source may be associated with a controller 8. The at least one controller 8 may as shown be an external unit or alternatively be integrated directly with the remaining light emitting device. The light emitting device 1 may comprise at least one of connectors 9 and an attachment element 9. The connecting elements 4 may be electrically conducting elements adapted for, in operation, conduct electricity and the nodes 3 may be adapted for, in operation, emitting light. The nodes 3 therefore each comprise at least one LED. FIG. 3A specifically shows a perspective view of a light emitting device 1 when in a stretched and linear configuration, while FIG. 3B shows a perspective view of a light emitting device 1 when in a rested and linear configuration. Thus, in FIGS. 3A and 4B each node 3 is connected to neighboring nodes 3 by two connection elements 4.

The person skilled in the art realizes that the present invention by no element is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting device comprising:
a body, a plurality of nodes, and
a plurality of connecting elements,
wherein each node of the plurality of nodes is separated from at least one other node of the plurality of nodes by one or more connecting elements of the plurality of connecting elements,
wherein at least one of the plurality of nodes and the plurality of connecting elements are attached to the body,
wherein one or more nodes of the plurality of nodes are a passive element or comprise an electrically conductive element,
wherein one or more connecting elements of the plurality of connecting elements are a light source,
wherein the body is at least one of flexible and stretchable, and the light source is at least one of a flexible linear light source and a stretchable linear light source,
wherein a length of the light source is larger than the distance between the node of the plurality of nodes that is separated from at least one other node of the plurality of nodes by the light source when the body is in a rest position, the rest position being achieved when no external forces are applied to shape or stretch the body, and
wherein the light emitting device comprises at least one of a carrier material and a cover material, and wherein the body is partially or fully in contact with at least one of the carrier material and the cover material.

2. A light emitting device according to claim 1, wherein the light source comprises a silicone-based polymer.

3. A light emitting device according to claim 1, wherein the light emitting device comprises a controller for controlling the light sources, or wherein each light source is associated with a controller.

4. A light emitting device according to claim 1, wherein at least one of the carrier material and the cover material is a stretchable, flexible and light diffusing material, or wherein the carrier material and the cover material are a silicone-based polymer.

5. A light emitting device according to claim 1, wherein the light emitting device comprises at least one of connectors and an attachment element.

6. A light emitting device according to claim 1, wherein the light emitting device comprises a system for at least one of detecting the stretching force and setting a maximum stretch limit.

7. A light emitting device according to claim 6, wherein the system for at least one of detecting the stretching force and setting a maximum stretch limit is associated with a controller, which is configured to control the light sources based on the detection of the stretching force.

8. A luminaire comprising a light emitting device according to claim 1.

* * * * *